United States Patent [19]

Hunley et al.

[11] Patent Number: 4,956,567
[45] Date of Patent: Sep. 11, 1990

[54] TEMPERATURE COMPENSATED BIAS CIRCUIT

[75] Inventors: Steven A. Hunley, Arlington; Kevin Ovens, Garland, both of Tex.

[73] Assignee: Texas Instruments Incorporated, Dallas, Tex.

[21] Appl. No.: 310,275

[22] Filed: Feb. 13, 1989

[51] Int. Cl.$^5$ ............................................. H03K 17/14
[52] U.S. Cl. .................................. 307/310; 307/296.7; 307/446; 323/907
[58] Field of Search ............... 307/443, 446, 451, 475, 307/570, 264, 296.7, 310; 323/313, 907

[56] References Cited

U.S. PATENT DOCUMENTS

| | | | |
|---|---|---|---|
| 3,648,153 | 3/1972 | Graf | 323/307 |
| 4,114,053 | 9/1978 | Turner | 307/310 |
| 4,228,371 | 10/1980 | Mazgy | 307/310 X |
| 4,249,091 | 2/1981 | Yamagiwa | 307/310 X |
| 4,260,946 | 4/1981 | Wheatley, Jr. | 323/226 |
| 4,313,082 | 1/1982 | Neidorff | 307/310 X |
| 4,542,331 | 9/1985 | Boyer | 323/313 |
| 4,686,449 | 8/1987 | Jeffrey et al. | 323/231 |
| 4,689,503 | 8/1987 | Suzuki et al. | 307/475 X |
| 4,733,110 | 3/1988 | Hara et al. | 307/446 |
| 4,745,304 | 5/1988 | Wilson | 307/310 X |
| 4,785,230 | 11/1988 | Ovens et al. | 323/313 |

FOREIGN PATENT DOCUMENTS 860029 8/1981 U.S.S.R. .

Primary Examiner—David Hudspeth
Attorney, Agent, or Firm—W. James Brady, III; James T. Comfort; Mel Sharp

[57] ABSTRACT

A temperature compensation circuit (FIG. 5a) has a controlled temperature compensated voltage drop across R1. A Schottky diode D1 is connected to the base of Q1 through resistor R1. The temperature coefficients of the base-emitter junction of Q1 and the diode D1 have a predetermined differential, preferably none. The forward voltage drop across D1 and the base-emitter junction are different, thereby establishing a controlled current through resistor R1 that is independent of temperature.

20 Claims, 7 Drawing Sheets

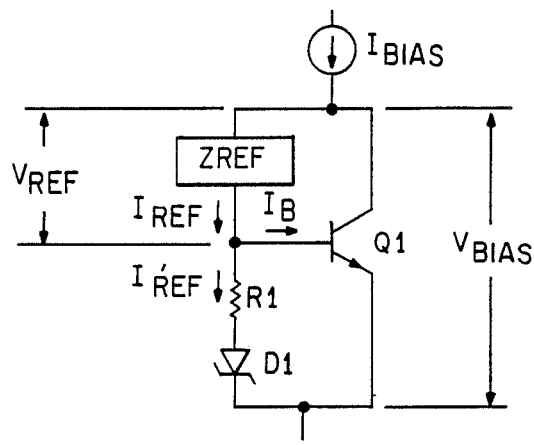
Fig. 5a
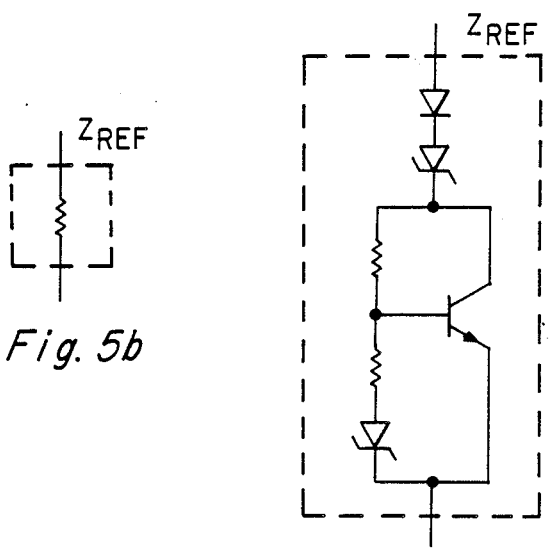
Fig. 5b
Fig. 5c

TEMPERATURE COMPENSATED BIAS CIRCUIT

BACKGROUND OF THE INVENTION

The invention relates to a bias circuit used for implementing a BiCMOS input buffer and, more generally, to a circuit for establishing a temperature compensated voltage at one or more nodes within an electrical circuit or system.

A BiCMOS circuit is implemented with a technology that is the result of merging the separate Bipolar and CMOS manufacturing technologies. This BiCMOS technology allows circuit designs to combine the individual performance advantages of Bipolar and CMOS transistors. Bipolar transistors are best suited for switching high current signals that are encountered when interfacing or connecting the outputs of one integrated circuit function with other circuits comprising an electrical system. CMOS transistors are best suited for implementing functions that are internal to an integrated circuit, where small feature size and low power consumption are desirable.

When Bipolar transistors are used to drive the output signals of an integrated circuit function, the interfacing logic standard that is adopted is typically one that is optimum for Bipolar designs. Most notable are the TTL and ECL logic standards. Optimum circuit designs using CMOS transistors, however, are not compatible with TTL or ECL signal voltage levels are the input interface, and must be buffered with conversion circuitry. An input buffer circuit that converts Bipolar signal voltage levels into CMOS signal voltage levels is typically not an optimum design for either Bipolar or CMOS transistors, and deserves special attention by the designer.

A typical TTL-to-CMOS input conversion buffer configuration is shown in FIG. 1. This circuit form employs a bias circuit, F, which modifies the behavior of the CMOS inverter stage, M1 and M2. For a standard CMOS design, the characteristic input threshold voltage, of the M1 and M2 inverter stage, would be equal to one half of the Vcc voltage, or approximately 2.5V. The addition of bias circuit, F, at node "B", between Vcc and M1, lowers the input threshold voltage to the TTL level of approximately 1.4V. In addition, the bias circuit receives a feedback signal from node "C", the non-inverting output of the buffer, for the purpose of creating hysteresis in the input threshold voltage behavior. Hysteresis causes the threshold voltage, for a signal that is transitioning high-to-low, to be lower than the threshold voltage for a signal transitioning low-to-high. A typical hysteresis value of 200mV would result in a nominal high-to-low transition threshold equal to 1.3V, and a nominal low-to-high transition threshold equal to 1.5V. Hysteresis is typically utilized in TTL-to-CMOS converter circuits to eliminate well-known CMOS switching instabilities.

Prior art methods of implementing the bias circuit, F, in a TTL-to-CMOS converter, are shown in FIGS. 2 and 3. The configuration shown in FIG. 2 is a carry-over from pure CMOS technologies, in which Bipolar devices were not available. During high-to-low input signal transitions, transistor M5 is initially "off", and the behavior of the bias circuit is determined by transistor M6. Conversely, during low-to-high signal transitions, transistor M5 is initially "on", shunting the effect of M6 and dominating the behavior of the bias circuit. The individual sizes of transistors M5 and M6, and their relationship to the sizes of transistors M1 and M2, determine the threshold voltages and the amount of resulting hysteresis. The configuration of FIG. 2, however, has been typically abandoned in favor of the configuration shown in FIG. 3. Replacing transistor M6 with junction diodes, D1 and D2, results in input threshold voltage characteristics that are less sensitive to manufacturing variations in the CMOS transistor parameters. In addition, diodes D1 and D2 contribute to a faster signal propagation time during the high-to-low input transition phase.

The introduction of the Bipolar junction diodes into the CMOS circuit, as shown in FIG. 3, yields a typical input threshold characteristic as shown graphically in FIG. 4. The chart displays input threshold voltage as a function of Temperature for both the low-to-high transition and the high-to-low transition. The chart also highlights the 0.8V and 2.0V TTL threshold specification limits. The threshold voltage of the buffer must be guaranteed to be between these limits over the operating voltage and temperature range of the integrated circuit. It can be seen from this chart, that the high-to-low transition threshold increases with increasing temperature (positive temperature coefficient), while the low-to-high transition threshold decreases with increasing temperature (negative temperature coefficient). These contrary threshold slopes cause the amount of hysteresis, the difference between the two thresholds, to rapidly diminish as the temperature increases. The primary cause of this behavior is that the high-to-low transition threshold is determined by the Bipolar junction diodes D1 and D2, which have a negative voltage temperature coefficient, and the low-to-high transition threshold is determined by CMOS transistor M5, which has a positive drain-to-source voltage temperature coefficient. In order to prevent the magnitude of hysteresis from diminishing below a minimum acceptable design level at high temperatures, the thresholds at low temperatures must be set unacceptably close to the TTL specification limits. If the voltage temperature coefficient magnitude of the Bipolar junction diodes could be reduced, or "compensated", then the resulting input threshold temperature characteristic slopes would be similar. The benefits of this compensated behavior would be, that the amount of hysteresis would change very little over temperature, and this would result in input threshold voltage characteristics that could be set to a greater margin within the TTL specification limits. A design with this desirable behavior has the advantage of being more tolerant of manufacturing variations, and hence, more conducive to higher manufacturing yields of the integrated circuit.

Accordingly, it is the object of this invention to provide a novel temperature compensated bias circuit. It is a further object of this invention to provide a temperature compensated bias circuit for a high performance TTL-to-CMOS input buffer implemented in the BiCMOS technology. It is a further object, still, of this invention, to provide a temperature compensated circuit that may be used throughout an electronic circuit or electronic system comprising a plurality of circuits.

SUMMARY OF INVENTION

The invention provides a temperature compensating circuit comprising a Bipolar transistor, a resistor, and a diode. The base-emitter junction of the transistor has a first forward voltage drop and an associated first temperature coefficient that both vary as a function of current. The resistor, or other device, and diode, preferably a Schottky diode, are coupled in series to the base of the transistor. The emitter and the diode-resistor series are coupled together, preferably directly, or through other components. The diode has a second forward voltage drop and associated second temperature coefficient that both vary as a function of current. The forward voltage drop of the diode is smaller than the forward voltage drop of the transistor and the differential of the two voltage drops is reflected in a third voltage drop across the resistor. The transistor and diode are sized to cause the respective first and second temperature coefficients to have a predetermined differential less than either of the two and, if so desired, a temperature coefficient differential that is zero or substantially zero, i.e. slightly positive or slightly negative. The temperature coefficient differential, and the variation of the resistor resistance over temperature, are reflected in a net third temperature coefficient of the third voltage drop across the resistor. The third voltage drop across the resistor and the associated third temperature coefficient represent a high-impedance temperature compensated voltage source which generates a temperature compensated source of current flowing through the resistor.

In one embodiment of the invention, a second resistor is coupled to the base of the transistor. In that particular circuit the temperature compensated source of current flowing through the first resistor also flows through the second resistor causing the voltage drop across the second resistor to be proportional to the voltage drop across the first resistor. This behavior represents a temperature compensated voltage multiplier whereby the voltage drop across the second resistor is equal to the voltage drop across the first resistor multiplied by the ratio of the second and first resistors.

In other embodiments of the invention, it is possible to connect further devices, circuits, or voltage sources, to the base of the transistor. These other connections may include a plurality of diodes, or another temperature compensating circuit that is substantially identical to the first.

DRAWINGS

FIG. 1—Circuit diagram showing general form of TTL-to-CMOS conversion buffer.

FIG. 2—Circuit diagram of prior art TTL-to-CMOS conversion buffer using all CMOS components.

FIG. 3—Circuit diagram of prior art TTL-to-CMOS conversion buffer incorporating bipolar junction diodes.

FIG. 4—Graph of input threshold voltage vs. temperature for prior art circuit in FIG. 3.

FIG. 5 (a-c)—Circuit diagram of invention showing both preferred and cascaded embodiments.

FIG. 6—Circuit diagram of TTL-to-CMOS conversion buffer using preferred embodiment of invention.

FIG. 7—Graph of input threshold voltage vs. temperature for circuit in FIG. 6.

DETAILED DESCRIPTION

Figure 1:
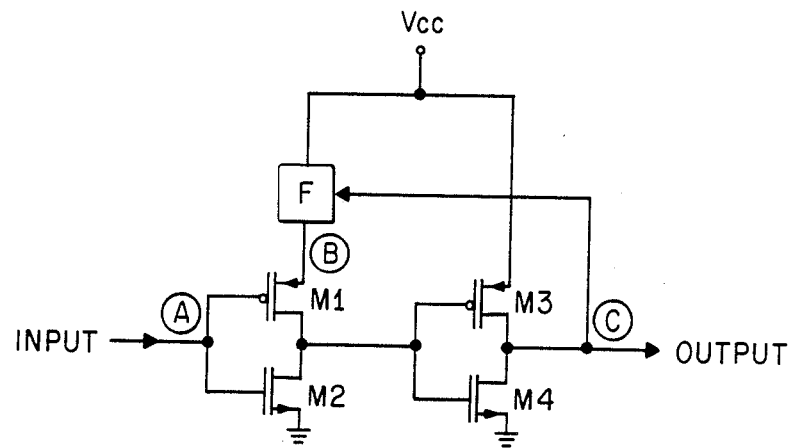

The invention provides a temperature compensating circuit composed of an NPN transistor Q1, a resistor R1, and a Schottky diode D1, as diagrammed in FIG. 5. This configuration will establish a temperature compensated current, Iref. The embodiment of the invention is accomplished by including additional circuit elements in the location denoted "Zref", which will produce a voltage, Vref, as a function of the temperature compensated current, Iref.

The current, Iref, is the sum of, the current flowing through resistor R1, Iref', and the current flowing into the base node of transistor Q1, Ib. Iref' is the dominant quantity since Ib is typically less than 10% of Iref'. The current, Iref', is a function of the voltage potential across R1, divided by the magnitude of R1. The voltage potential across R1 is equal to the difference between the Q1 base-emitter junction voltage, and the D1 junction voltage. In addition, the temperature dependency of the voltage across R1 is equal to the difference between the voltage temperature coefficients of the Q1 base-emitter junction voltage and the D1 junction voltage. At 25 degrees Centigrade, the Q1 base-emitter voltage is typically 800 to 900mV with a temperature coefficient of $-1.5$ to $-1.2$mV/degC, respectively, and the D1 junction voltage is typically 500 to 600mV with a temperature coefficient of $-1.4$ to $-1.1$mV/degC, respectively. As a result, the voltage across R1, at 25 degC may typically range from 0.2V to 0.4V with a temperature coefficient of $-0.4$ to $+0.2$mV/degC. Junction voltage and the associated temperature coefficient, is a function of the junction current density, and is determined by the current through the junction divided by the physical layout size of the junction.

It is a key feature of this invention that, for a given design, junction sizes for Q1 and D1 can be selected such that the their voltage temperature coefficients can be virtually identical, while their junction voltages are not identical. For such a case, the difference between the two junction voltages will yield a voltage across R1 that has a voltage temperature coefficient equal to zero or substantially zero, i.e. slightly positive or slightly negative. This results in a temperature compensated current Iref', that has no dependency upon junction voltage temperature coefficients or has a dependency that is controlled, i.e. determined by the difference between the chosen temperature coefficients of the diode and the base-emitter junction. It is a further result that the current Iref is also temperature compensated with no dependency upon junction voltage temperature coefficients or has a controlled, predetermined dependency.

In the circuit of FIG. 5b, a resistor is connected at the location denoted "Zref". If the magnitude of current Ib is considered negligibly small, compared to the magnitude of the current Iref', then Iref is approximately equal to Iref'. It follows that the voltage potential Vref across Zref, is equal to the resistance in Zref divided by the resistance R1, multiplied by the voltage across R1. This network forms a voltage multiplier producing a temperature compensated voltage, Vref, that is not dependent upon junction voltage temperature coefficients. In addition, the classical behavior of a resistor network multiplier implies that, Vref has no dependency upon resistance variations as a function of temperature. The only temperature dependency that Vref may exhibit will be due to variations in Ib caused by the gain of transistor Q1 changing as a function of temperature. If desired, this temperature dependency can be minimized by careful design of the elements R1, D1, and Q1.

In other embodiments of the invention, any combination of circuit elements may implemented at the location Zref in FIG. 5. An example of such a combination is shown in FIG. 5c, where the invention is cascaded in series with two junction diodes. This type of embodiment of the invention usually requires that the generated voltage, Vref, exhibits a variation with temperature that is a multiple of junction diode temperature coefficients, while at the same time, has no dependency upon resistance changes with temperature.

Figure 3:
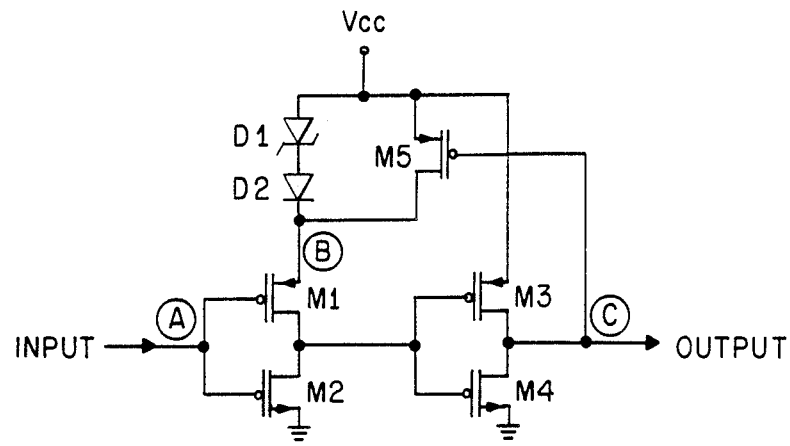
Figure 6:
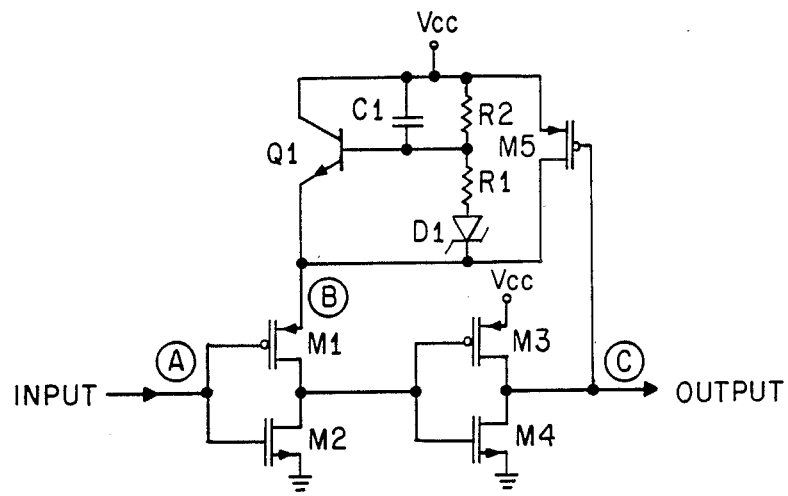

The preferred embodiment of the invention is shown in FIG. 6. This circuit is composed of CMOS and Bipolar components to implement a CMOS-to-Bipolar input conversion buffer, similar to the prior art circuit shown in FIG. 3. However, to achieve enhanced input threshold voltage behavior, the diodes, D1 and D2 in FIG. 3, have been replaced with Q1, D1, R1, R2, and C1, which results in a temperature compensated bias voltage at node B.

The circuit shown in FIG. 6, is fundamentally composed of two CMOS inverters, yielding a non-inverting signal path between the input, node A, and the output, node C. The first invertor, M1 and M2, is designed to interface with TTL standard input signals, while the second invertor, M3 and M4, is designed to output a standard CMOS signal to drive additional internal CMOS circuitry. The threshold (trigger voltage) of the input invertor, M1 and M2, is derived from the ratio of the M1 and M2 gate widths, and the voltage at node B. The ratio of M1 and M2 are set such that the inverter trigger voltage will be approximately 50% of the voltage at node B.

Figure 2:
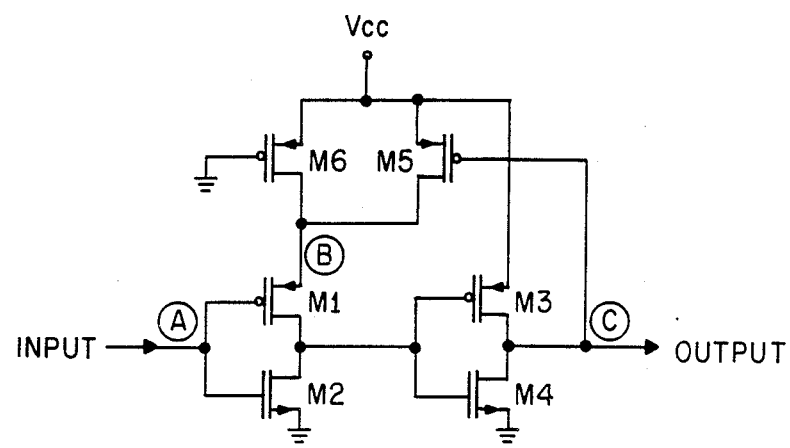

In order to achieve TTL level trigger voltages of approximately 1.5V, the voltage at node B must be approximately 3.0V. Since TTL logic systems typically do not provide secondary supply voltages of 3V, the voltage at node B must be generated internally within the integrated circuit. However, generating internal DC reference voltages requires additional power consumption that is unacceptable to typical CMOS design specifications. The solution employed in the circuit shown in FIG. 6, and in prior art shown in FIGS. 1,2, and 3, generates a bias voltage between the Vcc supply node and node B, by utilizing the transient current that passes through M1 and M2 during the switching transition period. In this way, the voltage at node B is established by a bias voltage that is self-generated by the CMOS inverter at precisely the moment that it is needed, and only for the duration of the threshold event.

There are two separate mechanisms, for generating the bias voltage that establishes the voltage at node B. They correspond to the separate input trigger voltages established for the high-to-low input signal transition and the low-to-high input signal transition. This allows the high-to-low threshold to be set at a lower voltage than the low-to-high threshold, thus producing "hysteresis" in the input threshold behavior. Hysteresis is employed in this circuit to overcome CMOS switching instabilities encountered, particularly during the high-to-low input signal transition.

Referring to FIG. 6, the circuitry which controls the input signal low-to-high threshold, consists of the P-channel transistor, M5, which is controlled by the buffer output signal at node C. This configuration is identical to that used in prior art shown in FIGS. 1, 2, and 3. In operation, when the input signal is in the logic "low" state (less than 0.8V), M1 is "on", M2 is "off", M3 is "off", and M4 is "on". This produces a logic low signal at the buffer output, node C, equal to 0V. In addition, transistor M5 is "on" since its gate, connected to node C, is at 0V. In this DC stable condition, M1 and M5 are in the "on" state, however, there is no current flowing through them due to M2 being in the high impedance "off" state. When no current is flowing through M1, the voltage at node B is approximately equal to the Vcc supply voltage. When the input signal transitions from the logic "low" state, to approaching the low-to-high trigger voltage, M2 begins turning "on". This causes current to flow through M5, M1, and M2. At this point, M3 and M4 have not changed state and node C remains in the logic "low" state. The current that is flowing through M5 generates an increasing bias voltage which causes the voltage at node B to begin decreasing. The bias voltage generated by M5 is such that the activation voltage of the other parallel components, R1, R2, D1, and Q1, is not satisfied. As a result, no significant current flows through these components, i.e, they are shunted by the dominant behavior of the M5 "on" state. As the input signal continues to rise, the current through M5, M1, and M2, increases and the voltage at node B continues to decrease. The input trigger voltage is reached when the voltage between node A and node B can no longer support the "on" state of M1. At this point, M1 begins turning "off", and the current passing through M5, M1, and M2, begins to decrease. At the same time, M3 begins turning "on", M4 begins turning "off", and node C begins transitioning to the logic "high" state. As the voltage at node C approaches the Vcc supply level, M5 turns "off". Further increase in the input signal level, above the trigger voltage, results in the DC stable condition where M1 is in the high impedance "off" state with no current flow, and the voltage at node B returns to the Vcc supply voltage level.

The behavior of the input signal high-to-low transition threshold, is dominated by the temperature compensating circuit comprising Q1, C1, R1, R2, and D1, as shown in FIG. 6. This circuit is the fundamental CMOS-TTL converter embodiment of the invention and will be compared directly with the prior art circuitry in FIG. 3, comprising D1 and D2. In operation, when the input signal is in the logic "high" state (greater than 2.0V), M1 is "off", M2 is "on", M3 is "on", and M4 is "off". This produces a logic "high" signal at the buffer output, node C, equal to the Vcc supply voltage. In addition, M5 is "off", since its gate, connected to node C, is at the Vcc supply voltage. In this DC stable condition, M2 is in the "on" state, however, no current is flowing since M1 is in the high impedance "off" state. When no current is flowing through M1, the voltage at node B is approximately equal to the Vcc supply voltage. When the input signal transitions from the logic "high" state, to approaching the high-to-low trigger voltage, M1 begins turning "on". This causes current to flow through M1, M2, Q1, C1, R1, R2, and D1. At this point, M3 and M4 have not changed state and node C remains in the logic "high" state. M5 remains in the "off" state, and the current flowing through Q1, C1, R1, R2, and D1, begins generating a bias voltage which causes the voltage at node B to decrease.

The presence of C1 provides an initial surge of base drive current to Q1 by momentarily shunting R2. This is necessary for achieving a fast response time of the bias voltage generation, and subsequently, a fast signal propagation time. As the input signal continues to decrease, the current through Q1 increases. However, the current through R1, R2, and D1, exhibits very little increase, and the generated bias voltage exhibits very little increase. At this point, the bias voltage generation circuitry, Q1, R1, R2, and D1, begins behaving like a fixed voltage reference. This is analogous to the behavior of the prior art circuitry, D1 and D2, shown in FIG. 3. In the prior art, the generated bias voltage is the sum of the junction voltages of D1 and D2. In the invention comprising Q1, R1, R2, and D1, the generated bias voltage is the sum of the Q1 base-emitter junction voltage and the voltage potential across R2. The voltage across R2 is a temperature compensated voltage derived from the difference between the Q1 base-emitter junction voltage and the D1 junction voltage, and is equal to this junction voltage differential multiplied by the ratio of R2/R1. It is critical to the input trigger voltage event that the generated bias voltage, between the Vcc supply node and node B, quickly achieve a limited reference value. When this happens, the voltage between node A and node B increases rapidly due to the continued rate of decrease of the input signal at node A. This accelerates the turning "on" of M1 and causes M2 to begin turning "off". At this point, the current passing through M1, Q1, R1, R2, and D1, begins to decrease. At the same time, M3 begins turning "off", M4 begins turning "on", node C begins transitioning to the logic "low" state, and M5 turns "on". Further decrease in the input signal level, below the trigger voltage, results in the DC stable condition where M2 is in the high impedance "off" state causing no current to flow through M1, and the voltage at node B returns to the Vcc supply voltage level.

Figure 4:
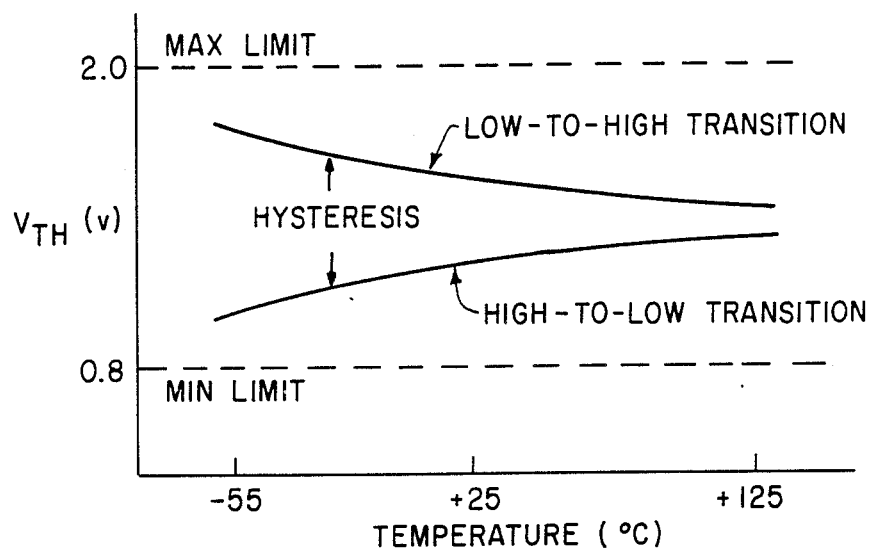
Figure 7:
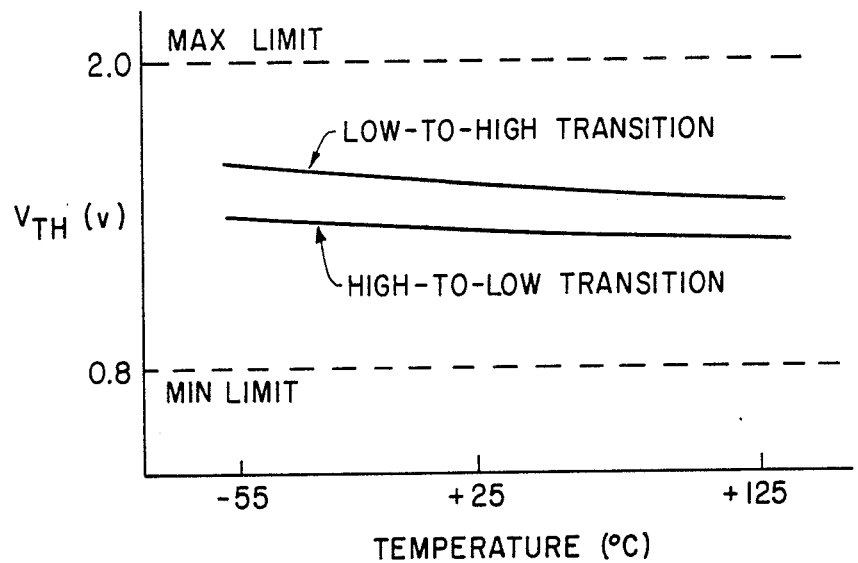

The input threshold voltage behavior, of the circuit diagramed in FIG. 6, is summarized in FIG. 7 by a graph of input threshold voltage vs. temperature. The high-to-low transition curve and the low-to-high transition curve both exhibit a negative temperature coefficient where the input threshold trigger voltage decreases with increasing temperature. The voltage differential between the two curves, the hysteresis, exhibits very little change with temperature. This behavior is contrasted by the characteristic performance of the prior art circuit of FIG. 3, which is shown graphically in FIG. 4. In the prior art circuit, the high-to-low threshold has a positive temperature coefficient which causes a significant change in hysteresis as temperature changes. This behavior is dominated by the total junction voltage temperature coefficient of the two series diodes, D1 and D2, and the resulting impact on the bias voltage that is established between the Vcc supply and node B.

In the circuit of FIG. 6, the application of the inventive temperature compensating circuit yields a bias voltage, between the Vcc supply and node B, that has a greatly reduced temperature coefficient. The reduction in the bias voltage temperature coefficient causes the CMOS transistor temperature coefficients to dominate the high-to-low threshold characteristics, and as a result, both the low-to-high and the high-to-low thresholds exhibit similar behavior.

Those skilled in the art will appreciate that the temperature coefficient of controlled node B is dependent upon the difference between the temperature coefficients of the base emitter junction of Q1 and diode D1. That difference can be reduced to nil by suitably sizing the transistor Q1 and diode D1. Or, the latter may be sized to give a predetermined, desired temperature coefficient to node B. Such a result would be desirable in order to compensate for variations in transistor gain as a function of temperature, to compensate for variations in the temperature coefficient of the resistor R2 (small, but possibly important at some temperature) or for other temperature variations of a component connected to node B or the diode D1 or transistor Q1. Likewise, those skilled in the art will appreciate that the order of the series connection of the diode D1 and resistor R1 can be reversed. Moreover, R1 may be a resistor or any other device that produces a voltage drop, e.g. a unipolar transistor. Such variations in temperature coefficients, circuit components and further routine changes, additions and modifications to the disclosed embodiments are deemed within the spirit and scope of the appended claims.

We claim:

1. A temperature compensated voltage multiplier comprising:
    a transistor having a base-emitter junction with a first forward voltage drop as a function of current and a first temperature coefficient;
    a first resistance and a diode coupled in series to said base, said diode having a second forward voltage drop as a function of current and a second temperature coefficient, said second forward voltage drop being less than said first forward voltage drop so that the voltage drop across said first resistance is established by and proportional to the difference between said first and second forward voltage drops and the temperature coefficient of said voltage drop is proportional to the difference between said first and second temperature coefficients; and
    a second resistance having one end coupled to said base and another end coupled to a collector of said transistor.

2. The voltage multiplier of claim 1 further comprising a capacitor coupled to the base of said transistor.

3. The voltage multiplier of claim 1 wherein the emitter and series coupled resistance and diode are coupled to a compensated node to provide a temperature compensated voltage at the compensated node.

4. The voltage multiplier of claim 3 further comprising:
    a buffer circuit having an input node and an output node, the buffer circuit being coupled to the compensated node; and
    a feedback transistor having a control electrode coupled to said output node and a current path coupled to said buffer circuit.

5. The voltage multiplier of claim 4 further comprising a capacitor coupled to the base of said transistor.

6. The voltage multiplier of claim 1 further comprising a voltage source coupled to the collector.

7. A temperature compensated bias circuit comprising:
    a transistor having a base-emitter junction with a first temperature coefficient;
    a resistance and diode coupled in series to said base, said diode having a second temperature coefficient, such that a voltage drop across the resistance has a third temperature coefficient proportional to the difference of said first and second temperature coefficients;
    the emitter and series coupled resistance and diode being coupled to a compensated node to provide a temperature compensated voltage at the compensated node.

8. The circuit of claim 7 further comprising a plurality of diodes coupled together in series and coupled to said base.

9. The circuit of claim 7 wherein the resistance comprises a unipolar transistor.

10. The circuit of claim 7 wherein the resistance comprises a resistor.

11. The circuit of claim 7 further comprising a second temperature compensated bias circuit coupled to said temperature compensated bias circuit.

12. The circuit of claim 11 wherein the second circuit is coupled to the base of the transistor of the first circuit.

13. The circuit of claim 11 further comprising a plurality of series connected diodes coupled to said second temperature compensated bias circuit.

14. The circuit of claim 7 wherein the base-emitter junction has a first forward voltage drop, the diode has a second forward voltage drop and the voltage drop across the resistance is proportional to the difference between the first and second voltage drops.

15. A BiCMOS logic level converter comprising:
 a first inverter comprising a pair of CMOS transistors for receiving a Bipolar logic level input signal and providing an inverted output signal;
 a second inverter coupled to the output of the first inverter and comprising a pair of CMOS transistors for providing an output at a CMOS logic level;
 a hysteresis circuit coupled between the output of the second inverter and the first inverter for maintaining a differential between high-to-low and low-to-high logic level transitions, said hysteresis circuit comprising a temperature compensated dynamic voltage reference source including:
 a Bipolar transistor having its emitter coupled to the first inverter;
 a diode and a first resistor coupled in series to the first inverter.

16. The BiCMOS converter of claim 15 wherein the diode and the first resistor are coupled to the base of the Bipolar transistor.

17. The BiCMOS converter of claim 15 further comprising a capacitor coupled to the base of said Bipolar transistor.

18. The BiCMOS converter of claim 15 further comprising a feedback transistor coupled between the output of the second inverter and the hysteresis circuit.

19. The BiCMOS converter of claim 15 wherein the base-emitter junction and the diode junction are sized to provide a predetermined net temperature coefficient for the voltage drop across the resistor in series with the diode.

20. The BiCMOS converter of claim 19 wherein the net temperature coefficient is substantially zero.

* * * * *